(12) United States Patent
Chen et al.

(10) Patent No.: US 11,264,471 B2
(45) Date of Patent: Mar. 1, 2022

(54) JUNCTION GATE FIELD-EFFECT TRANSISTOR (JFET) HAVING SOURCE/DRAIN AND GATE ISOLATION REGIONS

(71) Applicant: Taiwan Semiconductor Manufacturing Company, Ltd., Hsinchu (TW)

(72) Inventors: Chia-Chung Chen, Keelung (TW); Chi-Feng Huang, Zhubei (TW); Victor Chiang Liang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 25 days.

(21) Appl. No.: 16/570,482

(22) Filed: Sep. 13, 2019

(65) Prior Publication Data

US 2020/0006507 A1 Jan. 2, 2020

Related U.S. Application Data

(60) Division of application No. 15/882,796, filed on Jan. 29, 2018, now Pat. No. 10,658,477, which is a
(Continued)

(51) Int. Cl.
*H01L 29/423* (2006.01)
*H01L 29/66* (2006.01)
(Continued)

(52) U.S. Cl.
CPC .... *H01L 29/42316* (2013.01); *H01L 29/0649* (2013.01); *H01L 29/0692* (2013.01); *H01L 29/66901* (2013.01); *H01L 29/808* (2013.01)

(58) Field of Classification Search
CPC ........... H01L 29/42316; H01L 29/0649; H01L 29/0692; H01L 29/66901; H01L 29/808
See application file for complete search history.

(56) References Cited

U.S. PATENT DOCUMENTS 4,876,579 A 10/1989 Davis et al.
5,489,792 A 2/1996 Hu et al.
(Continued)

FOREIGN PATENT DOCUMENTS

WO 198602203 A1 4/1986

OTHER PUBLICATIONS

Hatfield, Christopher W., et al., "DC 1-V Characteristics and RF Performance of a 4H-SiC JFET at 773 K", IEEE Transactions on Electron Devices, vol. 45 No. 9, Sep. 1998, pp. 2072-2074.
(Continued)

*Primary Examiner* — Nelson Garces
(74) *Attorney, Agent, or Firm* — Slater Matsil, LLP

(57) ABSTRACT

A junction gate field-effect transistor (JFET) includes a substrate, a source region formed in the substrate, a drain region formed in the substrate, a channel region formed in the substrate, and at least one gate region formed in the substrate. The channel region connects the source and drain regions. The at least one gate region contacts one of the source and drain regions at an interface, and the at least one gate region is isolated from the other of the source and drain regions. A dielectric layer covers the interface while exposing portions of the gate region and the one of the source and drain regions.

19 Claims, 11 Drawing Sheets

Related U.S. Application Data division of application No. 14/322,193, filed on Jul. 2, 2014, now Pat. No. 9,882,012, which is a continuation-in-part of application No. 13/892,960, filed on May 13, 2013, now Pat. No. 9,287,413.

(51) Int. Cl.
*H01L 29/808* (2006.01)
*H01L 29/06* (2006.01)

(56) References Cited

U.S. PATENT DOCUMENTS

| | | | |
|---|---|---|---|
| 6,163,052 | A | 12/2000 | Liu et al. |
| 7,598,547 | B2 | 10/2009 | Pendharker et al. |
| 7,943,445 | B2 | 5/2011 | Anderson et al. |
| 7,969,243 | B2 | 6/2011 | Bracale et al. |
| 9,076,760 | B2 | 7/2015 | Hu et al. |
| 2005/0173726 | A1 | 8/2005 | Potts |
| 2009/0206375 | A1 | 8/2009 | Saha et al. |
| 2010/0032729 | A1* | 2/2010 | Hao ............... H01L 29/808 257/272 |
| 2010/0207173 | A1 | 8/2010 | Anderson et al. |
| 2010/0295097 | A1* | 11/2010 | Takenaka ......... H01L 29/7786 257/194 |
| 2011/0220973 | A1* | 9/2011 | Hu ............... H01L 29/66901 257/272 |
| 2012/0074469 | A1 | 3/2012 | Liu et al. |
| 2012/0292669 | A1 | 11/2012 | Candra et al. |
| 2013/0056801 | A1* | 3/2013 | Matsunaga ......... H01L 29/808 257/272 |
| 2013/0234202 | A1* | 9/2013 | JangJian ........... H01L 27/1464 257/184 |
| 2013/0265102 | A1* | 10/2013 | Lin ............... H01L 29/66901 327/530 |
| 2014/0001518 | A1 | 1/2014 | Huang et al. |
| 2014/0062578 | A1 | 3/2014 | Chan et al. |
| 2014/0332857 | A1 | 11/2014 | Chen et al. |
| 2014/0332858 | A1 | 11/2014 | Chen et al. |

OTHER PUBLICATIONS

Ohgihara, Takahiro et al., "GaAs JFET Front-End MMICs for L-Band Personal Communications", IEEE 1993 Microwave and Millimeter-Wave Monolithic Circuits Symposium, pp. 9-12.

Shi, Yun et al., "A Cost-Competitive High Performance Junction-FET (JFET) in CMOS Process for RF & Analog Applications", 2010 IEEE Radio Frequency Integrated Circuits Symposium, pp. 237-240.

* cited by examiner

JUNCTION GATE FIELD-EFFECT TRANSISTOR (JFET) HAVING SOURCE/DRAIN AND GATE ISOLATION REGIONS

PRIORITY CLAIM AND CROSS-REFERENCE

This application is a divisional of U.S. application Ser. No. 15/882,796, filed on Jan. 29, 2018, which is a divisional of U.S. application Ser. No. 14/322,193, filed on Jul. 2, 2014, now U.S. Pat. No. 9,882,012, issued on Jan. 30, 2018, which is a continuation-in-part of U.S. application Ser. No. 13/892,960, filed on May 13, 2013, now U.S. Pat. No. 9,287,413, issued on Mar. 15, 2016, which applications are hereby incorporated herein by reference.

BACKGROUND

Junction gate field effect transistors (JFET) provide various useful characteristics, such as low noise, fast switching speed, high power handling capability, etc. These characteristics make JFETs a design consideration in various power applications, such as power amplifiers.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
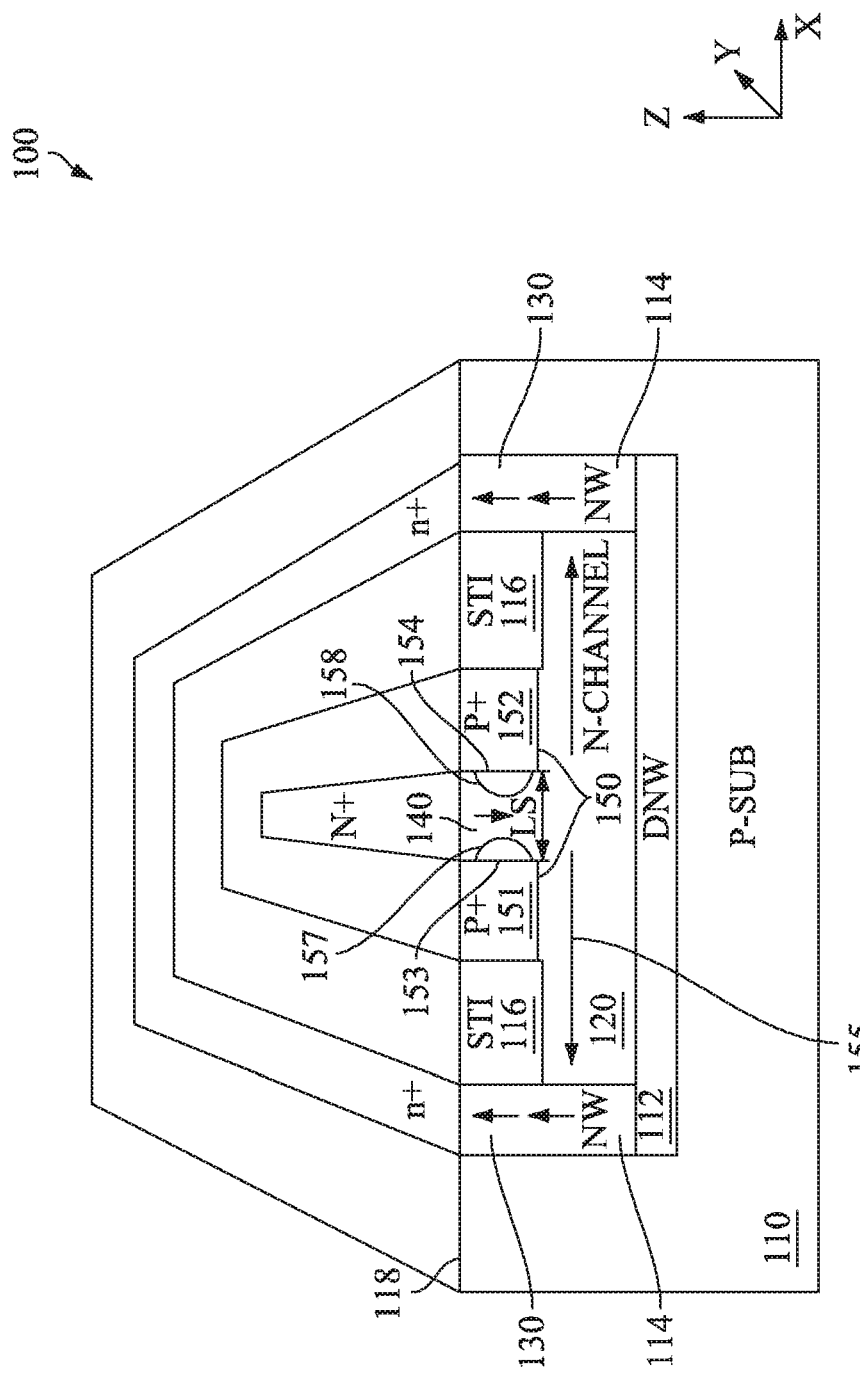
FIG. 1 is a perspective, partially cross-sectional view of an n-channel JFET (NJFET) in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent, however, that one or more embodiments may be practiced without these specific details. Like reference numerals in the drawings denote like elements.

In some embodiments, a JFET includes source and drain regions, a channel region connecting the source and drain regions, and a gate region. The gate region is configured to cause a depletion region to develop in one of the source and drain regions in response to a voltage applied to the gate region. This is different from other configurations where the gate region causes a depletion region to develop in the channel region. A JFET in accordance with some embodiments is a vertical JFET with the gate region at least partially co-elevational with the source and drain regions for reducing the JFET thickness. Further, it is possible to integrate the manufacturing process of a JFET in accordance with some embodiments in complementary metal-oxide-semiconductor (CMOS) processes, e.g., for making CMOS circuits on the same device or chip as the JFET.

FIG. 1 is a perspective, partially cross-sectional view of an NJFET 100 in accordance with some embodiments. The NJFET 100 comprises a substrate 110 with a deep n-well (DNW) 112, an n-well (NW) 114 and an isolation region (STI) 116 formed in the substrate 110 which also has an upper surface 118. The NJFET 100 further comprises a channel region 120, a drain region 130, a source region 140 and a gate region 150, all of which are formed in the substrate 110. The perspective, partially cross-sectional view in FIG. 1 illustrates about a half of the NJFET 100. The other half (not shown) of the NJFET 100 is structurally similar to the half shown in FIG. 1.

The substrate 110 has a thickness direction Z, and directions X and Y transverse to each other and also transverse to the thickness direction Z. The substrate 110 comprises an elementary semiconductor, a compound semiconductor, an alloy semiconductor, or combinations thereof. Examples of the elementary semiconductor include, but are not limited to, silicon and germanium. Examples of a compound semiconductor include, but are not limited to, silicon carbide, gallium arsenic, gallium phosphide, indium phosphide, indium arsenide, and indium antimonide. Examples of the alloy semiconductor include, but are not limited to, SiGe, GaAsP, AlInAs, AlGaAs, GaInAs, GaInP, and GaInAsP. Other semiconductor materials including group III, group IV, and group V elements are used in some embodiments. In one or more embodiments, the substrate 110 comprises a semiconductor on insulator (SOI), a doped epitaxial layer, a gradient semiconductor layer, and/or a stacked semiconductor structure with one semiconductor layer (e.g., Si) overlying another semiconductor layer (e.g., Ge) of a different type. In some embodiments, the substrate 110 comprises a p-type doped substrate which is denoted as P-sub in FIG. 1. Examples of p-type dopants in the p-doped substrate 110 include, but are not limited to, boron, gallium, and indium. In at least one embodiment, the substrate 110 comprises a p-type doped silicon substrate.

The deep n-well 112 and the n-well 114 are formed in the substrate 110. The deep n-well 112 and n-well 114 are weakly doped regions with n-type dopants. Examples of n-type dopants in the deep n-well 112 and/or n-well 114 include, but are not limited to, phosphorus and arsenic. The n-well 114 extends from the upper surface 118 of the substrate 110 downwardly in the thickness direction Z of the substrate 110 to contact the deep n-well 112. The deep n-well 112 and n-well 114 together define an n-doped structure that isolates the other components of the NJFET 100 from the p-doped substrate 110 and/or other circuitry formed in/on the substrate 110. The deep n-well 112 promotes electric current flowing along the channel region 120. In at least one embodiment, the deep n-well 112 and/or the n-well 114 is/are omitted. The isolation region 116 extends from the upper surface 118 of the substrate 110 downwardly in the thickness direction Z, and around the source region 140 and gate region 150. The isolation region 116 serves to isolate various regions of the NJFET 100 as described herein.

The channel region 120 is an n-channel having at least one n-type dopant doped therein. The drain region 130 is an n-doped region formed at an upper part of the n-well 114 adjacent the upper surface 118 of the substrate 110. The source region 140 is also an n-doped region formed adjacent the upper surface 118 of the substrate 110, and above the channel region 120. The channel region 120 contacts a lower part of the n-well 114 and the source region 140. The channel region 120 electrically connects the drain region 130 and the source region 140.

The gate region 150 is a p-doped gate disposed above the channel region 120. The gate region 150 extends around the source region 140. In the cross-sectional view in FIG. 1, the gate region 150 includes a first gate region 151 and a second gate region 152 on opposite sides of the source region 140. The first gate region 151 and second gate region 152 have corresponding interfaces 153, 154 with the source region 140. The first gate region 151 and second gate region 152 are isolated from the drain region 130 by the isolation region 116. The drain region 130, the source region 140 and the gate region 150 are at least partially co-elevational with each other in the thickness direction Z.

The NJFET 100 is a normally on device. During a period in which no voltage is applied to the gate region 150, the NJFET 100 is in a fully conductive state with the channel region 120 electrically connecting the drain region 130 and the source region 140. When the NJFET 100 is in the conductive state, electric current is permitted to flow along a current path 155 as indicated by the arrows in FIG. 1. Specifically, the current flows from the source region 140 downwardly in the thickness direction Z to the channel region 120, then flows in a direction X transverse to the thickness direction Z along the channel region 120 to the n-well 114, and then flows upwardly in the thickness direction Z to the drain region 130. By applying a reverse bias voltage to the gate region 150, it is possible to control a width of the current path 155 and, hence, a level of the current flowing from the source region 140 to the drain region 130 via the channel region 120. For the NJFET 100, the reverse bias voltage is a negative voltage. At a sufficiently high level of the reverse bias voltage, the current path 155 is pinched off and the NJFET 100 is switched off.

In particular, during a period in which a reverse bias voltage is applied to the gate region 150, a depletion region is caused to develop in the source region 140 and narrows the width of, or even pinches off, the current path 155. For example, upon application of a reverse bias voltage, depletion regions 157, 158 are developed in the source region 140 above the channel region 120. The depletion regions 157, 158 extend from the corresponding interfaces 153, 154 of the first and second gate regions 151, 152 with the source region 140 toward each other in the direction X transverse to the thickness direction Z of the substrate 110. The depletion regions 157, 158 reduce the width of the current path 155 and limit a level of the current flowing through the NJFET 100. As a level of the reverse bias voltage increases, the depletion regions 157, 158 increasingly extend toward each other and further reduce the width of the current path 155. At a sufficient level of the reverse bias voltage, i.e., a pinch-off voltage, the current path 155 is pinched off and the NJFET 100 is switched off.

In the NJFET 100, the depletion regions are caused to develop in the source region 140, above the channel region 120. This is different from other configurations where a depletion region is caused to develop in the channel region. To cause a depletion region to develop in the channel region, the other configurations include a bottom gate below the channel region, and the depletion region is developed and expanded in the thickness direction of the substrate. The inclusion of a bottom gate below the channel region increases the thickness of the device. To the contrary, a bottom gate is not included in a JFET in accordance with some embodiments, thereby reducing the device thickness.

One or more electrical characteristics of the NJFET 100 are variable in accordance with some embodiments by varying a length LS of the source region 140, i.e., the length between the first gate region 151 and the second gate region 152. For example, the longer the length LS is, the higher the pinch-off voltage will be. By varying or controlling the length LS, the pinch-off voltage will be varied or controlled accordingly. The variation or control (also referred to herein as "scalability") of the length LS in the direction X in accordance with some embodiments is easier than in the other configurations where a channel depth of the channel region is to be controlled or varied in the thickness direction. As a result, it is possible in some embodiments to design and/or manufacture JFETs with reliable electrical characteristics and/or without a risk of an unacceptably high or low pinch-off voltage.

It is further possible to integrate JFETs in accordance with some embodiments with CMOS processes, as described herein. The integration of JFET manufacture in CMOS processes provides low cost solutions for various power application modules where JFETs are used. Examples of such power application modules include power amplifiers, especially radio frequency (RF) power amplifiers, e.g., for cell phones or similar wireless devices. In some embodiments, the RF performance of the RF power amplifiers is enhanced by using a bulk or high resistance substrate, such as an 8-12 ohmic Si substrate, as the substrate 110.

Figure 2:
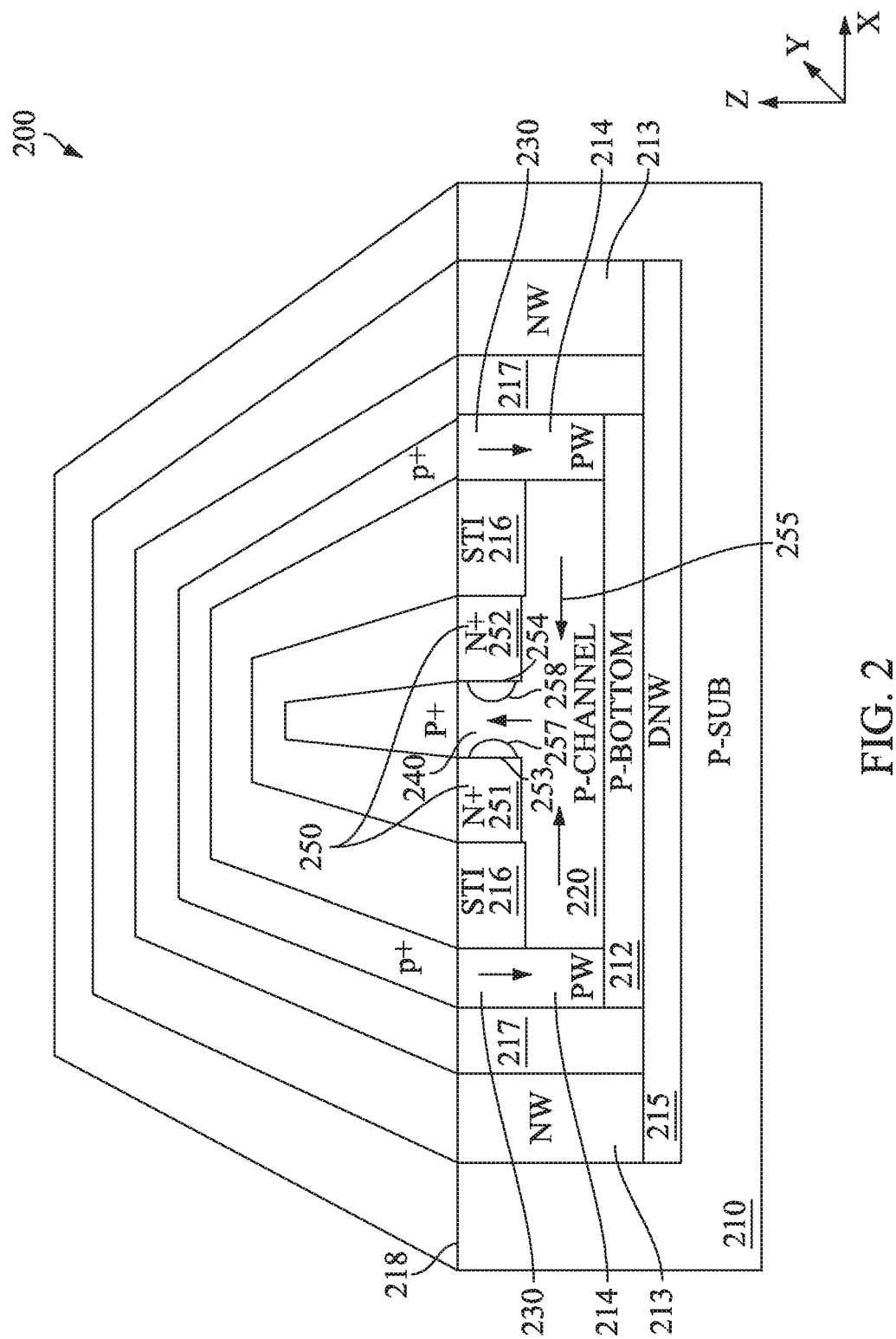
FIG. 2 is a perspective, partially cross-sectional view of a p-channel JFET (PJFET) in accordance with some embodiments.

FIG. 2 is a perspective, partially cross-sectional view of a PJFET 200 in accordance with some embodiments. The PJFET 200 comprises a substrate 210 with p-doped bottom region (P-bottom) 212, an n-well (NW) 213, a p-well (PW) 214, a deep n-well (DNW) 215, and an isolation region (STI) 216 formed in the substrate 210. A section 217 of the substrate 210 is positioned between the n-well 213 and the p-well 214. In some embodiments, the section 217 is another isolation region. The n-well 213, p-well 214, isolation region 216, and substrate section (or isolation region) 217 extend from an upper surface 218 of the substrate 210 downwardly in the thickness direction Z. The PJFET 200 further comprises a channel region 220, a source region 230, a drain region 240 and a gate region 250, all of which are formed in the substrate 110. The perspective, partially cross-sectional view in FIG. 2 illustrates about a half of the PJFET 200. The other half (not shown) of the PJFET 200 is structurally similar to the half shown in FIG. 2.

In some embodiments, the substrate 210 is similar to the substrate 110 of the NJFET 100. For example, the substrate 210 is a p-doped substrate. The p-doped bottom region 212 and the p-well 214 correspond to the deep n-well 112 and the n-well 114 of the NJFET 100. The p-doped bottom region 212 and p-well 214 are weakly doped regions with p-type dopants. The p-well 214 extends from the upper surface 218 of the substrate 210 downwardly in the thickness direction Z to contact the p-doped bottom region 212. The p-doped bottom region 212 promotes electric current flowing along the channel region 220. In at least one embodiment, the p-doped bottom region 212 and/or the p-well 214 is/are omitted. The isolation regions 116, 117 serve to isolate various regions of the PJFET 200 as described herein.

The n-well 213 and deep n-well 215 are weakly doped regions with n-type dopants. The n-well 213 extends from the upper surface 218 of the substrate 210 downwardly in the thickness direction Z to contact the deep n-well 215. The n-well 213 extends around the p-well 214, and is isolated from the p-well 214 by the substrate section (or isolation region) 217. The deep n-well 215 is formed below the p-doped bottom region 212. In one or more embodiments, the deep n-well 215 contacts the p-doped bottom region 212. In at least one embodiment, the deep n-well 215 is spaced from the p-doped bottom region 212. The deep n-well 215 and n-well 213 together define an n-doped structure that isolates the other components of the PJFET 200 from the p-doped substrate 210 and/or other circuitry formed in/on the substrate 210.

The channel region 220, source region 230, drain region 240 and gate region 250 correspond to the channel region 120, drain region 130, source region 140 and gate region 150 of the NJFET 100. The channel region 220, is a p-channel having at least one p-type dopant doped therein. The source region 230 is a p-doped region formed at an upper part of the p-well 214 adjacent the upper surface 218 of the substrate 210. The drain region 240 is also a p-doped region formed adjacent the upper surface 218 of the substrate 210, and above the channel region 220. The channel region 220 contacts a lower part of the p-well 214 and the drain region 240. The channel region 220 electrically connects the source region 230 and the drain region 240.

The gate region 250 is an n-doped gate disposed above the channel region 220. The gate region 250 extends around the drain region 240. In the cross-sectional view in FIG. 2, the gate region 250 includes a first gate region 251 and a second gate region 252 on opposite sides of the drain region 240. The first gate region 251 and second gate region 152 have corresponding interfaces 253, 254 with the drain region 240. The first gate region 251 and second gate region 252 are isolated from the source region 230 by the isolation region 216. The source region 230, the drain region 240 and the gate region 250 are at least partially co-elevational with each other in the thickness direction Z.

The PJFET 200 operates similarly to the NJFET 100. Specifically, during a period in which there is no voltage applied to the gate region 250, the PJFET 200 is in a fully conductive state with the channel region 220 electrically connecting the source region 230 and the drain region 240. When the PJFET 200 is in the conductive state, electric current is permitted to flow along a current path 255 as indicated by the arrows in FIG. 2. Specifically, the current flows from the source region 230 downwardly in the thickness direction Z to the channel region 220, then flows in a direction X transverse to the thickness direction Z along the channel region 220, and then flows upwardly in the thickness direction Z to the drain region 240. During a period in which a reverse bias voltage, i.e., a positive voltage, is applied to the gate region 250, depletion regions 257, 258 are developed in the drain region 240 above the channel region 220. The depletion regions 257, 258 extend from the corresponding interfaces 253, 254 toward each other in the direction X, and reduce the width of the current path 255 and limit a level of the current flowing through the PJFET 200. As a level of the reverse bias voltage increases, the depletion regions 257, 258 increasingly extend toward each other and further reduce the width of the current path 255. At a sufficient level of the reverse bias voltage, i.e., a pinch-off voltage, the current path 255 is pinched off and the PJFET 200 is switched off. One or more effects described with respect to the NJFET 100 are also obtainable in the PJFET 200 in accordance with some embodiments.

Figure 3A:
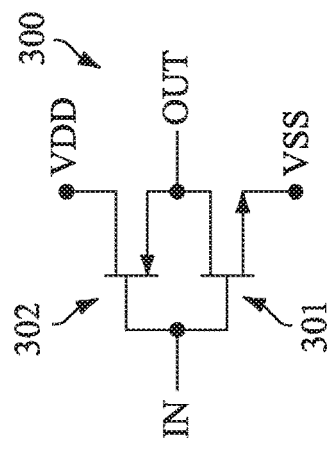
FIG. 3A is a circuit diagram of a semiconductor device.

FIG. 3A is a circuit diagram of a semiconductor device 300. The semiconductor device 300 includes an NJFET 301 and a PJFET 302. Gate regions of the NJFET 301 and PJFET 302 are connected together, and to an input node IN for receiving an input signal at the input node IN. A drain region of the NJFET 301 and a source region of the PJFET 302 are connected together, and to an output node OUT for outputting an output signal at the output node OUT. A source region of the NJFET 301 is connected to a first voltage terminal VSS to receive a first power supply voltage, e.g., the ground voltage. A drain region of the PJFET 302 is connected to a second voltage terminal VDD to receive a second power supply voltage, e.g., a positive power supply voltage.

Figure 3B:
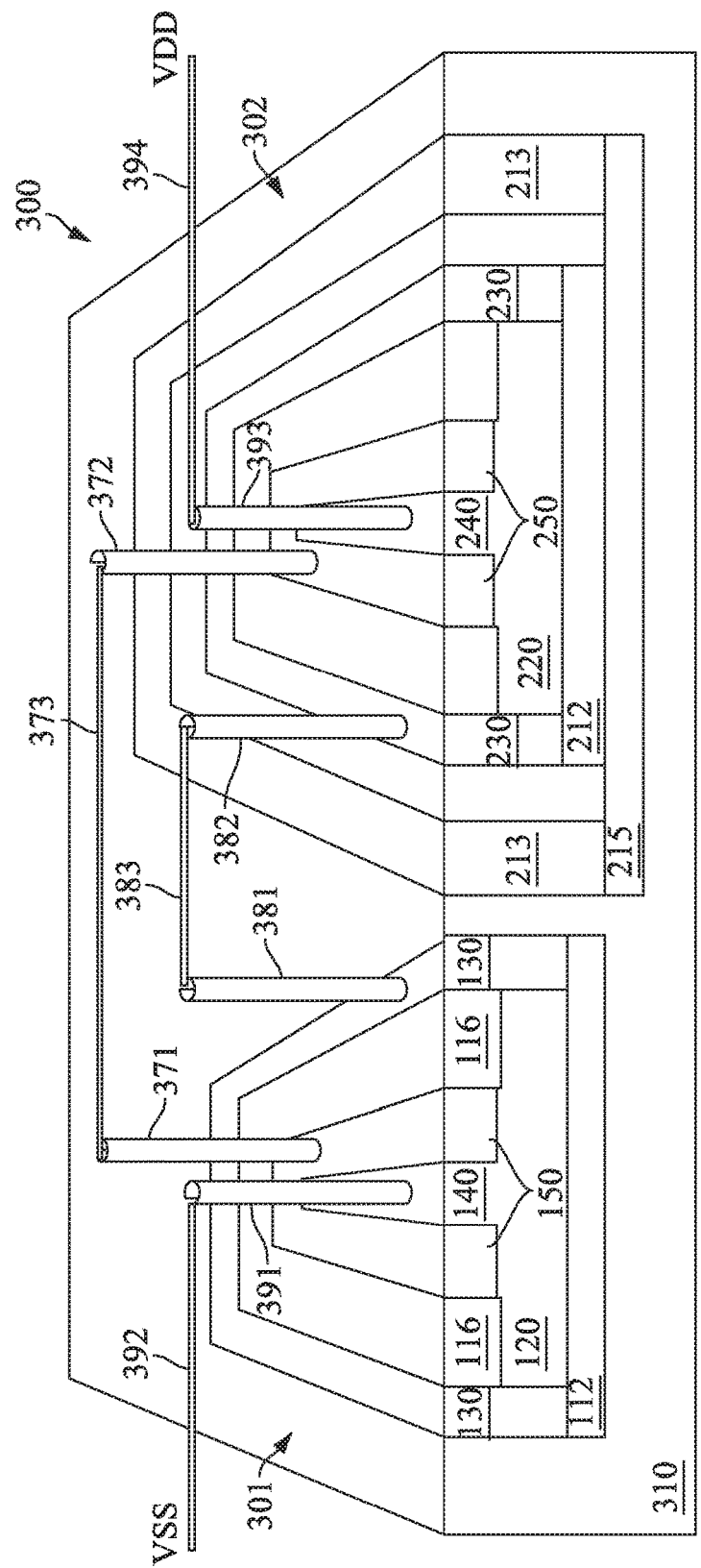
FIG. 3B is a perspective, partially cross-sectional view of the semiconductor device in accordance with some embodiments.

FIG. 3B is a perspective, partially cross-sectional view of the semiconductor device 300 in accordance with some embodiments. The NJFET 301 and PJFET 302 of the semiconductor device 300 are formed in the same substrate 310 which is similar to the substrate 110 or substrate 210. The NJFET 301 is configured similar to the NJFET 100, and the PJFET 302 is configured similar to the PJFET 200. The gate regions 150, 250 of the NJFET 301 and PJFET 302 are connected to corresponding to vias 371, 372 embedded in one or more dielectric layers (not shown) formed over the substrate 310. The vias 371, 372 are connected together and to the input node IN by a conductive layer 373. The drain region 130 of the NJFET 301 and the source region 230 of the PJFET 302 are to corresponding to vias 381, 382 embedded in the one or more dielectric layers formed over the substrate 310. The vias 381, 382 are connected together and to the output node OUT by a conductive layer 383. The source region 140 of the NJFET 301 is connected to a corresponding via 391 embedded in the one or more dielectric layers formed over the substrate 310. The via 391 is connected to the ground voltage terminal VSS by a conductive layer 392. The drain region 240 of the PJFET 302 is connected to a corresponding via 393. The via 393 is connected to the positive voltage terminal VDD by a conductive layer 394.

The semiconductor device 300 operates as an inverter that inverts the input signal received at the input node IN, and outputs the inverted signal as the output signal at the output node OUT. The semiconductor device 300 further functions as a power amplifier that amplifies an amplitude of the input signal to a higher level of the positive power supply voltage at the terminal VDD. In accordance with some embodiments, by configuring the NJFET 301 as the NJFET 100 and/or the PJFET 302 as the PJFET 200, one or more effects described herein with respect to the NJFET 100 and/or PJFET 200 are achievable in the semiconductor device 300. One or more further effects, such as low noise, high breakdown voltage, fast switching speed, etc. are also achievable in the semiconductor device 300 in accordance with some embodiments.

Figure 4:
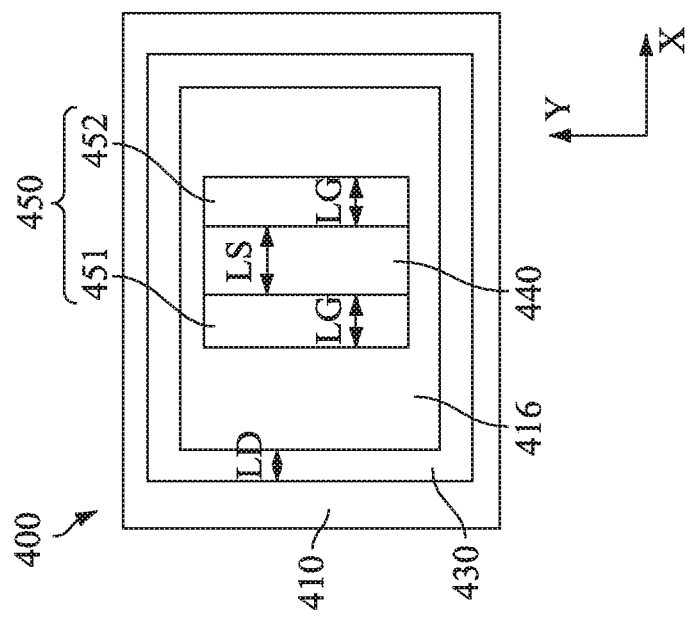
FIG. 4 is a top plan view of a JFET in accordance with some embodiments.

FIG. 4 is a top plan view of an NJFET 400 in accordance with some embodiments. The NJFET 400 is formed in a substrate 410 having an isolation region 416. The NJFET 400 comprises a drain region 430, a source region 440, and a gate region 450. In some embodiments, the substrate 410, isolation region 416, drain region 430, source region 440 and gate region 450 correspond to the substrate 110, isolation regions 116, drain region 130, source region 140 and gate region 150 of the NJFET 100. The gate region 450 has first and second gate regions 451, 452 corresponding to the first and second gate regions 151, 152 of the gate region 150. However, unlike the first gate region 151 and second gate region 152 which are connected with each other as best seen in FIG. 1, the first gate region 451 and second gate region 452 are disconnected from each other as best seen in FIG. 4. In some embodiments, the same gate voltage, e.g., a reverse bias voltage, is applied to both the first gate region 451 and second gate region 452 in operation. In at least one embodiment, different gate voltages are applied to the first gate region 451 and second gate region 452 in operation, to vary electrical characteristics of the NJFET 400. In at least one embodiment, one of the first gate region 451 and second gate region 452 is omitted.

Each of the first gate region 451 and second gate region 452 has a gate length LG. In at least one embodiment, the gate length of the first gate region 451 is different from the gate length of the second gate region 452. The drain region 430 has a drain length LD, and the source region 440 has a source length LS. One or more of the gate length LG, the drain length LD, and the source length LS is/are variable or scalable to achieve intended electrical characteristics for the NJFET 400, while remaining in compliance with a plurality of design rules to ensure that the NJFET 400 can be manufactured. The description and effect(s) of the NJFET 400 are also applicable to a PJFET in accordance with some embodiments.

Figure 5:
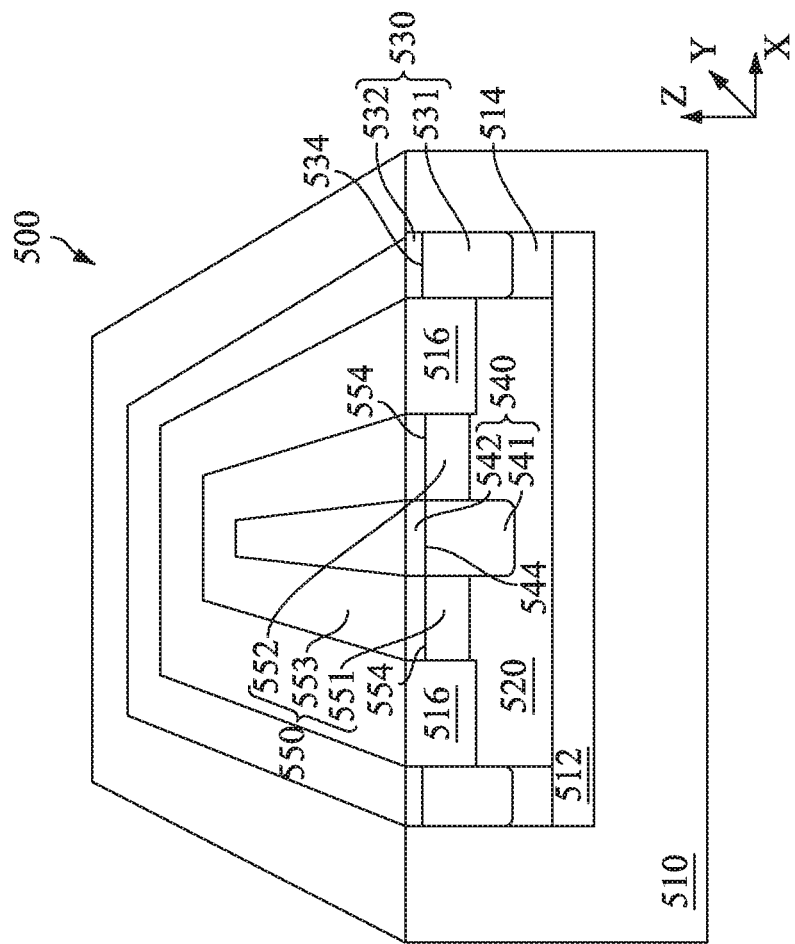
FIG. 5 is a perspective, partially cross-sectional view of a JFET in accordance with some embodiments.

FIG. 5 is a perspective, partially cross-sectional view of an NJFET 500 in accordance with some embodiments. The NJFET 500 is formed in a substrate 510 having an isolation region 516 and an n-well 514. The NJFET 500 comprises a drain region 530, a source region 540, and a gate region 550. In some embodiments, the substrate 510, n-well 514, isolation region 516, drain region 530, source region 540 and gate region 550 correspond to the substrate 110, n-well 114, isolation regions 116, drain region 130, source region 140 and gate region 150 of the NJFET 100. The gate region 550 has first and second gate regions 551, 552 corresponding to the first and second gate regions 151, 152 of the gate region 150.

At least one of the drain region 530 and source region 540 has a corresponding drain or source enhancement layer. The enhancement layer has a dopant of the same type as the channel region 520, and a doping concentration of the dopant higher than in the channel region 520. For example, the drain region 530 has a drain enhancement layer 531 with an n-type dopant, i.e., the same dopant type as the channel region 520. A doping concentration of the n-type dopant in the drain enhancement layer 531 is higher than in the channel region 520. For example, in at least one embodiment, the n-type dopant in the drain enhancement layer 531 has a doping concentration of about $100 \times 10^{14}$ atoms/cm3 and the n-type dopant in the channel region 520 has a doping concentration of about $450 \times 10^{12}$ atoms/cm3. The drain enhancement layer 531 is formed in an upper part of the n-well 514 and at least partially co-elevational with the first and second gate regions 551, 552. In at least one embodiment, the drain enhancement layer 531 contacts the channel region 520. The drain region 530 further comprises a drain contact layer 532 which forms an ohmic or schottky contact 534 with the drain enhancement layer 531.

Similar to the drain region 530, the source region 540 includes a source enhancement layer 541, and a source contact layer 542 forming an ohmic or schottky contact 544 with the source enhancement layer 541. The source enhancement layer 541 has the same dopant type, i.e., n-type, as the channel region 520, with a higher doping concentration. In at least one embodiment, the doping concentration of the n-type dopant in the source enhancement layer 541 is the same as that in the drain enhancement layer 531. In at least one embodiment, the doping concentrations of the n-type dopant in the source enhancement layer 541 and the drain enhancement layer 531 are different. The source enhancement layer 541 is at least partially co-elevational with the first and second gate regions 551, 552, and contacts the channel region 520. In at least one embodiment, the drain enhancement layer 531 or the source enhancement layer 541 is omitted. The gate region 550 also includes a gate contact layer 553 which forms an ohmic or schottky contact 554 with the first and second gate regions 551, 552.

Because the enhancement layers 531 and 541 have higher doping concentrations than the channel region 520, the enhancement layers 531 and 541 have lower resistances than the channel region 520. The lower resistances of the enhancement layers 531 and 541 reduce the ON resistance of the NJFET 500. The ohmic or schottky contacts 534, 544, 554 further improve electrical performance of the gate region 550. The description and effect(s) of the NJFET 500 are also applicable to a PJFET in accordance with some embodiments.

Figure 6:
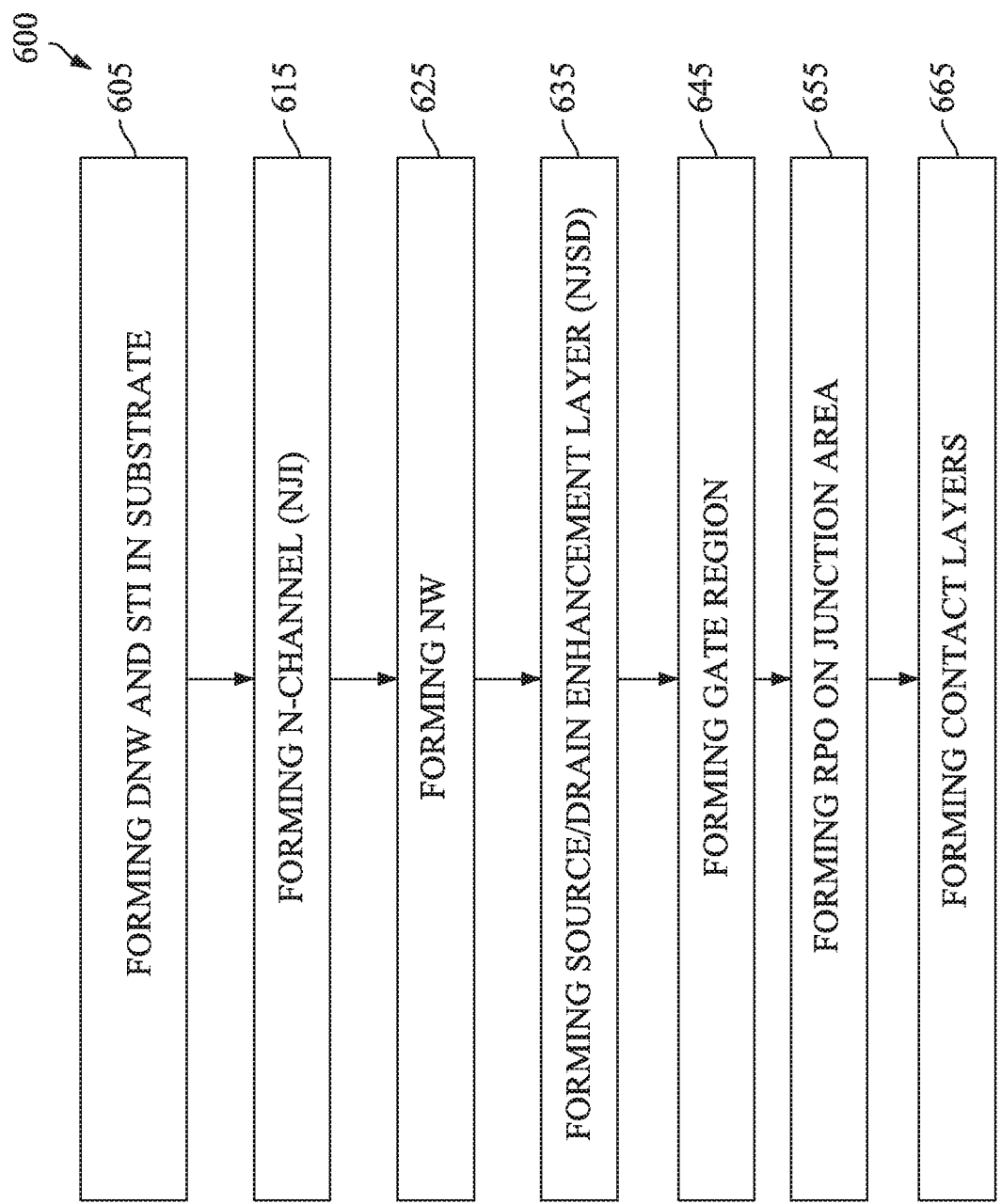
FIG. 6 is a flow chart of a method of manufacturing an NJFET in accordance with some embodiments.

FIG. 6 is a flow chart of a method 600 of manufacturing an NJFET, and FIGS. 7A-7D are cross-sectional views of the NJFET at various stages during the manufacturing method 600, in accordance with some embodiments.

Figure 7A:
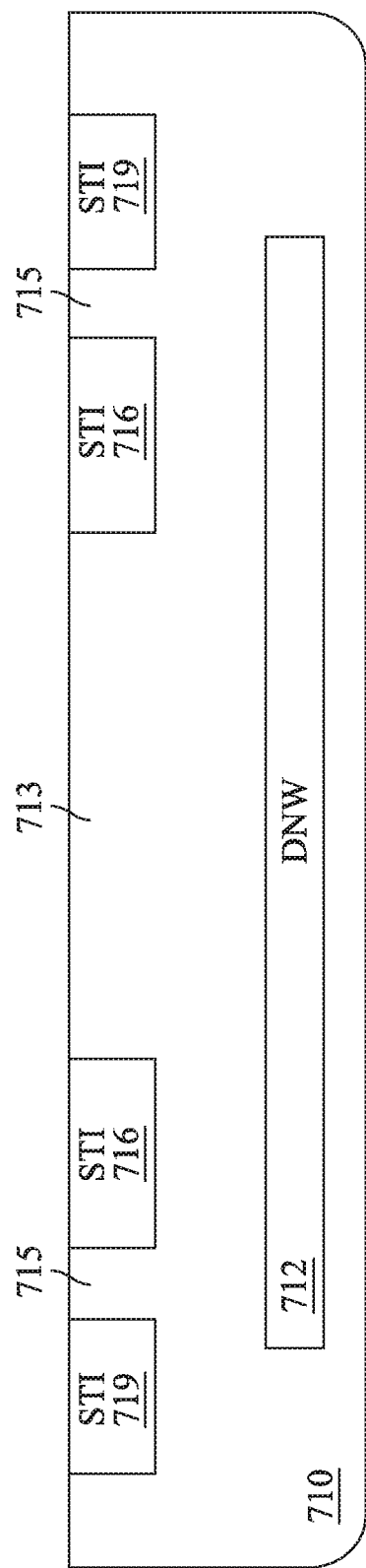
FIGS. 7A-7D are cross-sectional views of an NJFET at various stages during manufacture in accordance with some embodiments.

At operation 605 in FIG. 6, a deep n-well and one or more isolation regions are formed in a substrate. For example, as illustrated in FIG. 7A, a deep n-well 712 and isolation regions 716, 719 are formed in a substrate 710. In at least one embodiment, the substrate 710, isolation region 716, and deep n-well 712 correspond to the substrate 510, isolation region 516 and deep n-well 512 of the NJFET 500. The isolation region 716 extends around a portion 713 of the substrate 710 where a source region and a gate region of the NJFET are to be formed. The isolation region 719 extends around the portion 713, the isolation region 716 and a portion 715 of the substrate 710 where a drain region of the NJFET is to be formed. In this aspect, the isolation region 719 is similar to the substrate section (or isolation region) 217 described with respect to FIG. 2.

In some embodiments, the deep n-well 712 is formed in the substrate 710 by depositing a photoresist (not shown) over the substrate 710 and patterning the deposited photoresist to form a mask (not shown) having a pattern of the deep n-well 712. The mask is used in an ion implantation performed to implant an n-type dopant into the substrate 710 to form the deep n-well 712. In at least one embodiment, the ion implantation is controlled by one or more of energy, dose, and implantation angle to implant the n-type dopant sufficiently deep into the substrate 710. The mask is subsequently removed.

In some embodiments, the isolation regions 716 and 719 are formed in the substrate 710 by forming trenches (not shown) in the substrate 710, then filling the trenches with an isolation material, such as silicon oxide. The trenches are formed by in at least one embodiment by lithographic and/or etching processes. The depth and/or width of the isolation regions 716 and 719 are selected according to the design and/or intended electrical characteristics of the NJFET to be manufactured.

Figure 7B:
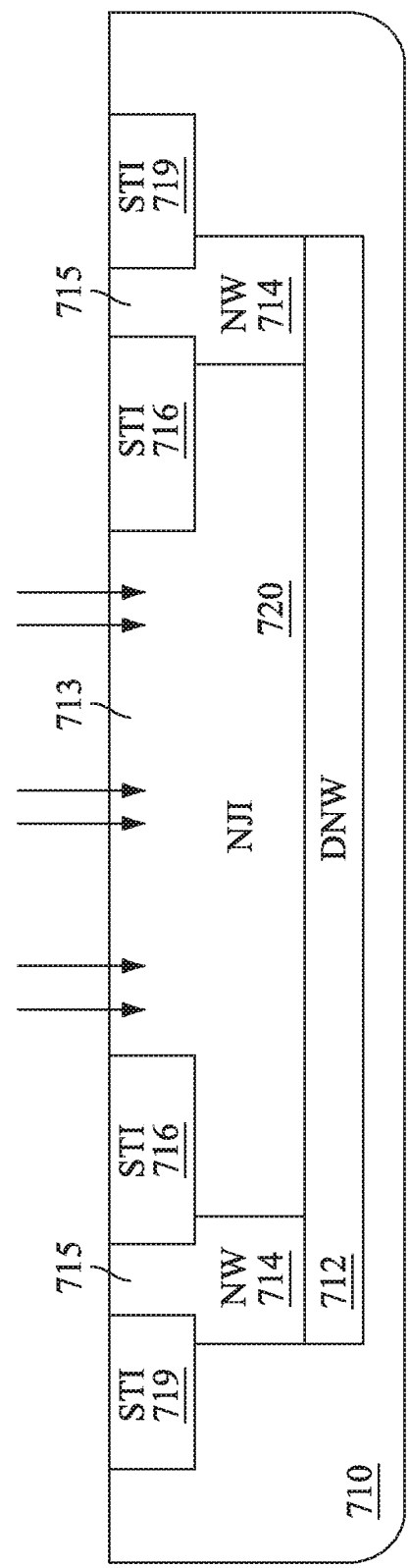

At operation 615 in FIG. 6, an n-channel region is formed in the substrate. For example, as illustrated in FIG. 7B, a channel region (NJI) 720 is formed in the section 713 of the substrate 710. In at least one embodiment, the channel region 720 corresponds to the channel region 520 of the NJFET 500. In some embodiments, the channel region 720 is formed by creating a mask and then using the mask in an ion implantation performed to implant an n-type dopant into the substrate 710. The mask for forming the channel region 720 is created in a manner similar to that described with respect to operation 605. The ion implantation for forming the channel region 720 is controlled by one or more of energy, dose, and implantation angle. In at least one embodiment, the doping concentration or doping dose for forming the channel region 720 is higher than that for forming the deep n-well 712.

At operation 625 in FIG. 6, an n-well is formed in the substrate. For example, as illustrated in FIG. 7B, an n-well 714 is formed in the section 715 of the substrate 710. In at least one embodiment, the n-well 714 corresponds to the n-well 514 of the NJFET 500. The n-well 714 has an upper part co-elevational with and confined between the adjacent isolation regions 716, 719. The n-well 714 further has a lower part below the isolation regions 716, 719. The lower part of the n-well 714 contacts the deep n-well 712 and the channel region 720. The lower part of the n-well 714 extends sideways to be partially located under one or both of the isolation regions 716, 719. In some embodiments, the n-well 714 is formed in a manner similar to that described with respect to channel region 720, but with a different mask.

Figure 7C:
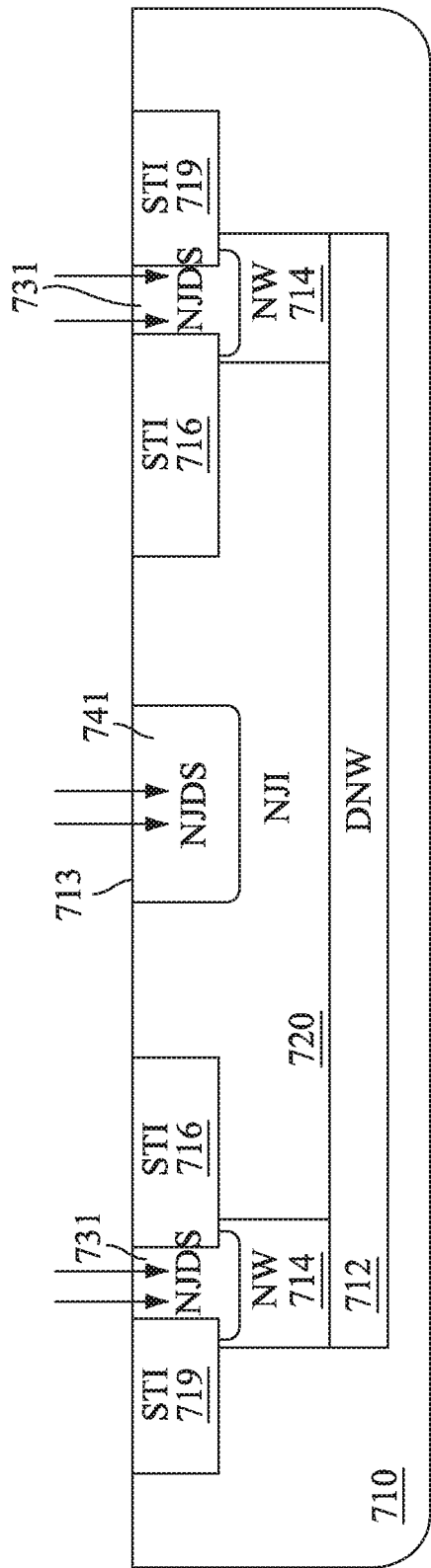

At operation 635 in FIG. 6, source and/or drain enhancement layers is/are formed in the substrate. For example, as illustrated in FIG. 7C, drain and source enhancement layers (NJDS) 731, 741 are formed at locations corresponding to the drain region and the source region of the NJFET to be manufactured. In at least one embodiment, the drain and source enhancement layers 731, 741 correspond to the drain and source enhancement layers 531, 541 of the NJFET 500. The drain enhancement layer 731 is formed over the upper part of the n-well 714 and between the adjacent isolation regions 716, 719. The drain enhancement layer 731 further extends below the isolation regions 716, 719, and has a portion located under one or both of the isolation regions 716, 719. In at least one embodiment, the drain enhancement layer 731 contacts the channel region 720. The source enhancement layer 741 is formed in a middle part of the section 713 and contacts the channel region 720. In some embodiments, the enhancement layers 731, 741 are formed in a manner similar to that described with respect to channel region 720, but with a different mask and with a higher dopant concentration.

Figure 7D:
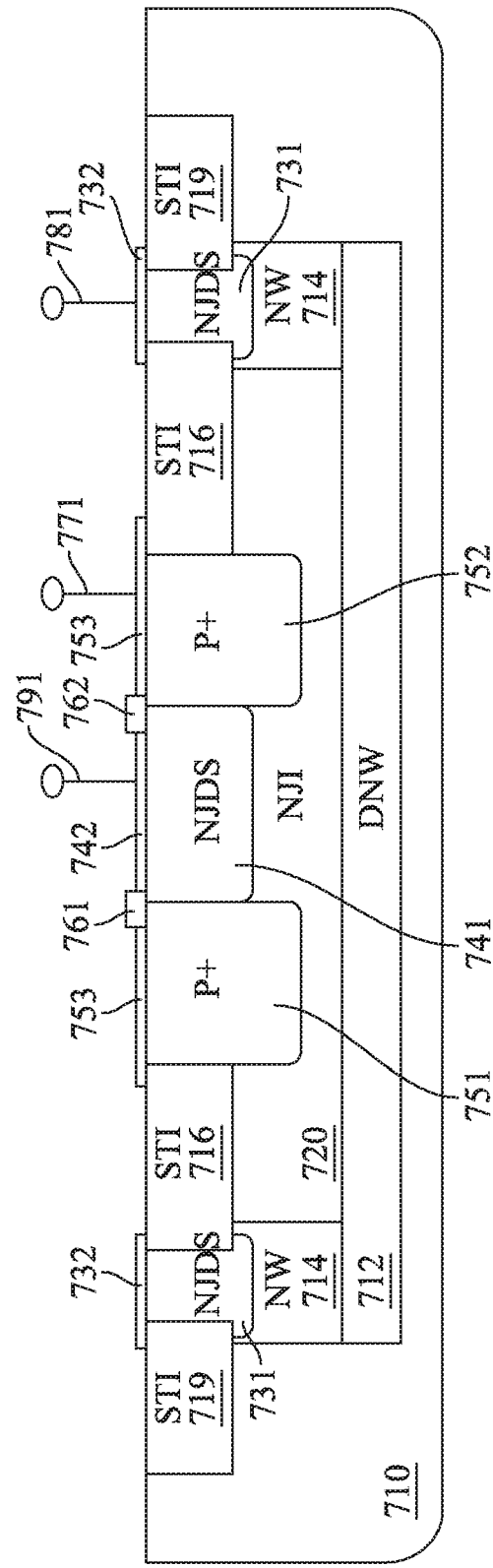

At operation 645 in FIG. 6, a gate region is formed in the substrate. For example, as illustrated in FIG. 7D, first and second gate regions 751, 752 are formed as p-doped regions in the substrate 710. In at least one embodiment, the first and second gate regions 751, 752 correspond to the first and second gate regions 551, 552 of the NJFET 500. Each of the first and second gate regions 751, 752 contacts the isolation region 716 and the source enhancement layer 741. In some embodiments, the first and second gate regions 751, 752 are formed in a manner similar to that described with respect to channel region 720, but with a different mask and with a p-type dopant.

At operation 655 in FIG. 6, a dielectric layer, such as a resist protective oxide (RPO) layer, is formed over the junction area between the source and gate regions. For example, as illustrated in FIG. 7D, RPO layers 761, 762 are formed over the corresponding junction areas between the first gate region 751 and the source enhancement layer 741, and between the second gate region 752 and the source enhancement layer 741. The RPO layers 761, 762 serve to isolate subsequently formed contact layers from contacting each other. In at least one embodiment, the RPO layer is formed by depositing a dielectric material, such as silicon oxide and/or silicon nitride, over the substrate 710, and etching away the dielectric material outside the junction areas.

At operation 665 in FIG. 6, one or more of drain, source and gate contact layers is/are formed over the corresponding to drain, source and gate regions. For example, as illustrated in FIG. 7D, a drain contact layer 732, a source contact layer 742 and a gate contact layer 753 are formed over the corresponding drain enhancement layer 731, source enhancement layer 741, and first and second gate regions 751, 752. In at least one embodiment, the drain contact layer 732, source contact layer 742 and gate contact layer 753 correspond to the drain contact layer 532, source contact layer 542 and gate contact layer 553 of the NJFET 500. In some embodiments, the drain, source and gate contact layers 732, 742 and 753 are silicide layers in ohmic (or schottky) contact with the corresponding, underlying drain, source and gate regions. Such silicide layers are formed, in at least one embodiment, by depositing a metal, such as Ti, Co, Ni, etc. over the structure previously formed over the substrate 710, annealing the substrate 710 with the structure and the deposited metal thereon to have the metal react with silicon in the drain, source and gate regions, and then removing the unreacted metal. The source contact layer 742 and the gate contact layer 753 are separated from each other by the RPO layers 761, 762. The RPO layers 761, 762 are at least partially co-elevational with the drain contact layer 732, source contact layer 742 and gate contact layer 753. The NJFET is thus obtained.

Further processes are subsequently performed in some embodiments to connect the NJFET with other circuitry. For example, one or more dielectric layers (not shown) are deposited over the substrate 710 with the NJFET formed there on, and contact vias 771, 781, 791 are formed in the one or more dielectric layers to be in electric contact with the corresponding gate, drain and source contact layers 753, 732, 742. In at least one embodiment, the contact vias 771, 781, 791 correspond to the vias 371, 381, 391 described with respect to semiconductor device 300.

It is possible to integrate operations of the method 600 for manufacturing the JFET in accordance with some embodiments in CMOS processes for manufacturing CMOS circuitry on the same substrate (e.g., on the same wafer). Two additional masks and the associated ion implantations are added for forming the channel region and the source and/or drain enhancement layers. Thus, it is possible to manufacture JFETs in accordance with some embodiments by CMOS processes, with insignificant changes to the CMOS processes, thereby obtaining a low cost product (e.g., power amplifier) with one or more advantages of the JFET as described herein.

Figure 8:
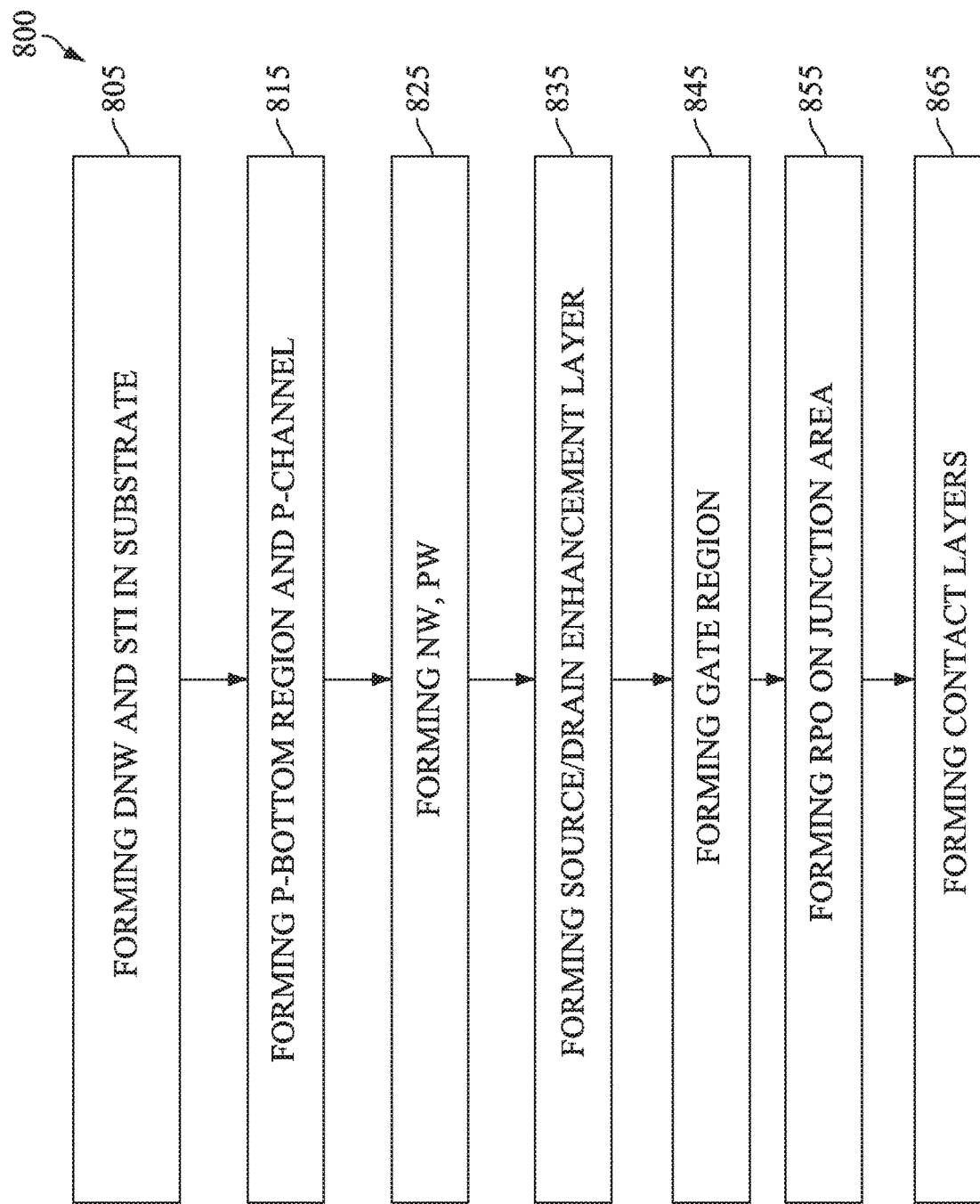
FIG. 8 is a flow chart of a method of manufacturing a PJFET in accordance with some embodiments.

FIG. 8 is a flow chart of a method 800 of manufacturing a PJFET in accordance with some embodiments.

At operation 805, a deep n-well and one or more isolation regions are formed in a substrate, for example, as described with respect to operation 605.

At operation 815, a p-bottom region and a p-channel are formed in the substrate. For example, a p-bottom region 212 and a p-channel 220 are formed in a substrate 210 as described with respect to the PJFET 200. The p-bottom region and p-channel are formed by creating a mask and then using the mask in an ion implantation performed to implant a p-type dopant into the substrate, in a manner similar to that described with respect to operation 615 except for the dopant type. In at least one embodiment, the p-bottom region and the p-channel are formed by using the same mask. In at least one embodiment, the p-type dopant concentration or dose of the p-bottom region is lower than that of the p-channel.

At operation 825, an n-well and a p-well are formed in the substrate. For example, an n-well 213 and a p-well 214 are formed in the substrate 210 as described with respect to the PJFET 200. In at least one embodiment, the formation of the n-well is similar to operation 625. The formation of the p-well is similar to the formation of the n-well, except a different mask and a p-type dopant are used.

At operation 835, source and/or drain enhancement layers is/are formed in the substrate. For example, source and/or drain enhancement layers similar to the source and/or drain enhancement layers 741, 731 described with respect to operation 635 are formed, using similar mask creating and ion implantation processes, except that a p-type dopant is used.

At operation 845, a gate region is formed in the substrate. For example, gate regions similar to first and second gate regions 751, 752 described with respect to operation 645 are formed, using similar mask creating and ion implantation processes, except that an n-type dopant is used.

At operation 855, a dielectric layer, such as an RPO layer, is formed over the junction area between the drain and gate regions, for example, as described with respect to operation 855.

At operation 865, one or more of drain, source and gate contact layers is/are formed over the corresponding to drain, source and gate regions, for example, as described with respect to operation 865.

The effect(s) of the method 600 is/are also applicable to the method 800 accordance with some embodiments.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

Figure 9:
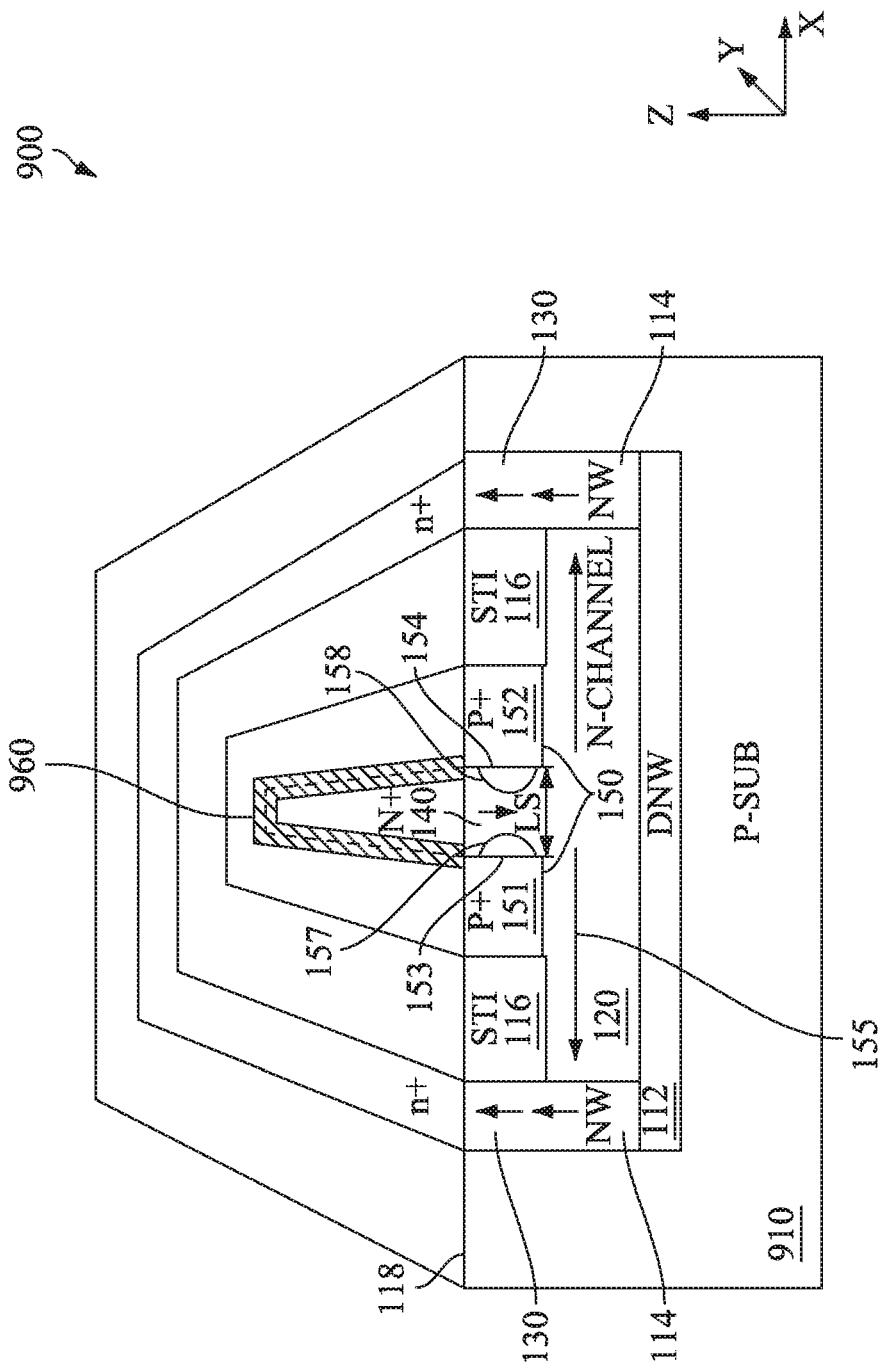
FIG. 9 is a perspective, partially cross-sectional view of an NJFET in accordance with some embodiments.

FIG. 9 is a perspective, partially cross-sectional view of an NJFET 900 in accordance with some embodiments. Similarly to FIG. 1, the perspective, partially cross-sectional view in FIG. 9 illustrates about a half of the NJFET 900. The other half (not shown) of the NJFET 900 is structurally similar to the half shown in FIG. 9. Compared to the NJFET 100 described with respect to FIG. 1, the NJFET 900 is formed in a substrate 910 and has a dielectric layer 960 covering the interface of the gate region 150 with the source region 140.

In some embodiments, the substrate 910 comprises an SOI substrate. In at least one embodiment, the substrate 910 comprises a 5000-10000 ohmic Si substrate, i.e., a Si substrate having a resistivity in a range from 5000 to 10000 ohm·cm.

In some embodiments, the dielectric layer 960 comprises an RPO material as described with respect to the RPO layers 761, 762 in FIG. 7D. The dielectric layer 960 covers the interface between the gate region 150 and the source region 140, while exposing other portions of the gate region 150 and the source region 140 for electrical contact between the NJFET 900 and other circuitry. In at least one embodiment, the dielectric layer 960 completely covers, from above, the entire interface between the gate region 150 and the source region 140. In a plan view of the substrate 910 in the example configuration illustrated in FIG. 9, the drain region 130 extends around the gate region 150, the gate region 150 extends around the dielectric layer 960, and the dielectric layer 960 extends around the source region 140.

An operation of the NJFET 900 is similar to the operation of the NJFET 100 described with respect to FIG. 1. For example, when a reverse bias voltage is applied to the gate region 150, the depletion regions 157, 158 are caused to extend from the interface 153, 154 into the source region 140.

Some embodiments provide a PJFET (not shown) which is similar to the PJFET 200 described with respect to FIG. 2, but is formed in a substrate similar to the substrate 910 and has a dielectric layer similar to the dielectric layer 960 covering the interface between the gate region 250 and the drain region 240. An operation of such PJFET is similar to the operation of the PJFET 200 described with respect to FIG. 2.

In some embodiments, by providing a dielectric layer, such as the dielectric layer 960, over the interface between the gate region and the corresponding source or drain region of a JFET, the breakdown voltage of the JFET is increased. This effect is particularly useful in one or more embodiments where the substrate of the JFET is a high-resistivity substrate, such as an SOI substrate. Specifically, an increased leakage current potentially induces early turning-ON of a parasitic bipolar junction transistor (BJT) in the JFET, which, in turn, potentially causes a burnt-out structure between electrical contacts on top of the gate region and the corresponding source or drain region. By forming a dielectric layer between the electrical contacts on top of the gate region and the corresponding source or drain region, e.g., by forming the dielectric layer 960 between the electrical contacts on top of the gate region 150 and the source region 140, leakage current is reduced, and the voltage at which the BJT is turned ON is increased, which means the JFET has an increased breakdown voltage.

In some embodiments, the width of the dielectric layer is a factor that affects how the breakdown voltage of the JFET is improved. In at least one embodiment, the width of the dielectric layer is in a range from 0.5 to 5 µm (micron). In some situations, a dielectric layer having a width smaller than 0.5 µm is insufficient to reduce leakage current and/or increase the breakdown voltage. In some situations, a dielectric layer having a width larger than 5 µm does not necessarily result in further breakdown voltage improvement, yet such large dielectric layer potentially consumes excessive material and/or leaves insufficient areas for electrical contacts on the gate region and/or the corresponding source or drain region. The described size and material of the dielectric layer are examples. Other arrangements are within the scope of various embodiments.

Figure 10:
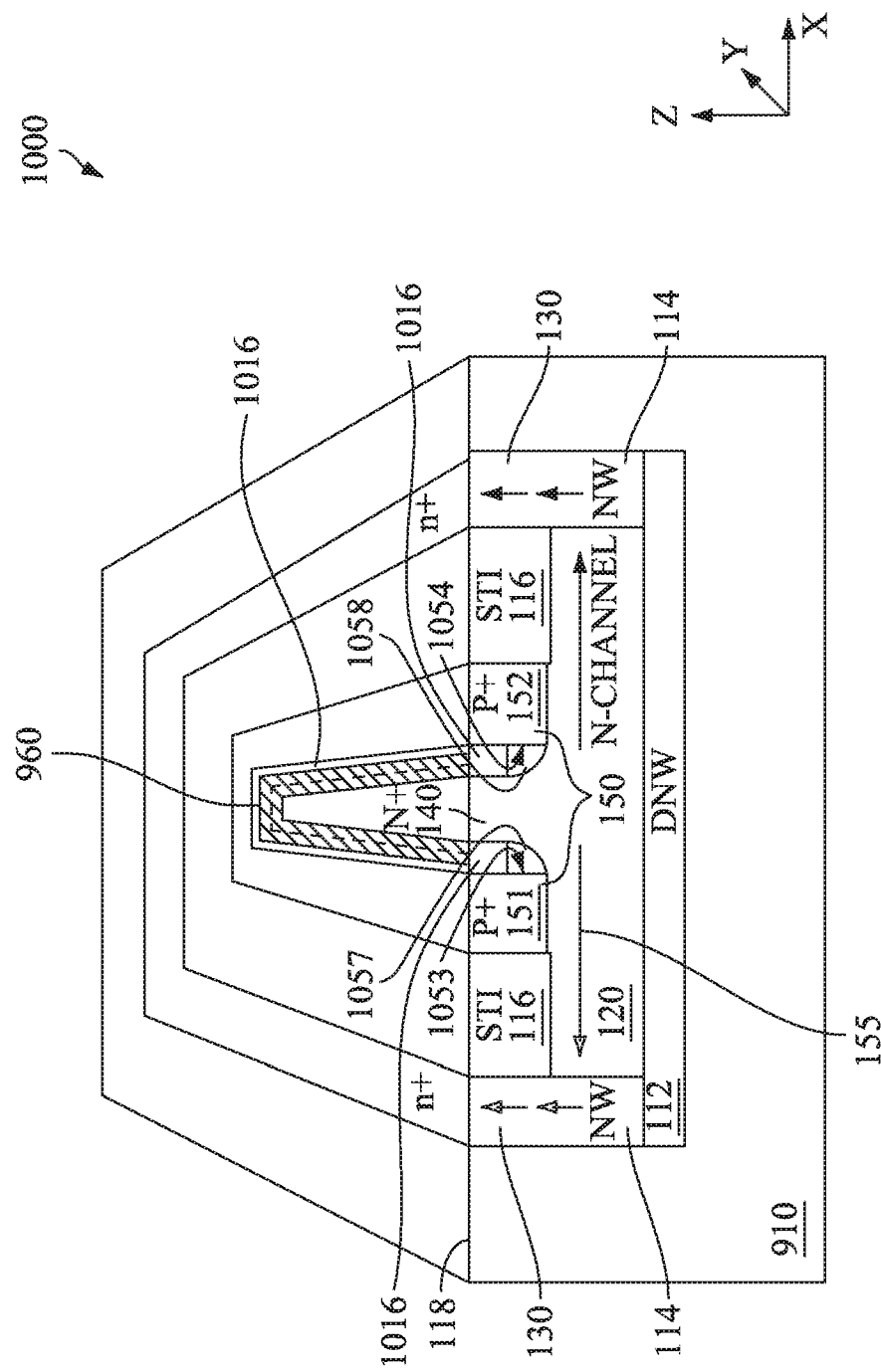
FIG. 10 is a perspective, partially cross-sectional view of an NJFET in accordance with some embodiments.

FIG. 10 is a perspective, partially cross-sectional view of an NJFET 1000 in accordance with some embodiments. Similarly to FIG. 1, the perspective, partially cross-sectional view in FIG. 10 illustrates about a half of the NJFET 1000. The other half (not shown) of the NJFET 1000 is structurally similar to the half shown in FIG. 10. Compared to the NJFET 900 described with respect to FIG. 9, the NJFET 1000 has an isolation region 1016 under the dielectric layer 960.

The isolation region 1016 is arranged between the gate region 150 and the source region 140. More particularly, the isolation region 1016 is arranged between upper parts of the gate region 150 and the source region 140, while still permitting lower parts of the gate region 150 and the source region 140 to contact each other at interfaces 1053, 1054 corresponding to interfaces 153, 154 described with respect to FIG. 1. In a plan view of the substrate 910 in the example configuration illustrated in FIG. 10, the drain region 130 extends around the gate region 150, the gate region 150 extends around the dielectric layer 960 and the isolation region 1016, and the dielectric layer 960 and the isolation region 1016 extend around the source region 140. In the example configuration illustrated in FIG. 10, the dielectric layer 960 is narrower than the isolation region 1016, and a portion of the isolation region 1016 is exposed from under the dielectric layer 960. Other width relationships between the dielectric layer 960 and the isolation region 1016 are within the scope of various embodiments. In at least one embodiment, materials and/or manufacturing processes of the isolation region 1016 are similar to those of the isolation region 116 described with respect to FIG. 1. The described configurations of the isolation region 1016 are examples. Other arrangements are within the scope of various embodiments.

An operation of the NJFET 1000 is similar to the operation of the NJFET 100 described with respect to FIG. 1. For example, when a reverse bias voltage is applied to the gate region 150, the depletion regions 1057, 1058, corresponding to but smaller than the depletion regions 157, 158 described with respect to FIG. 1, are caused to extend from the interface 1053, 1054 into the source region 140.

Some embodiments provide a PJFET (not shown) which is similar to the PJFET described with respect to FIGS. 2 and 9, but is formed with an isolation region similar to the isolation region 1016. An operation of such PJFET is similar to the operation of the PJFET 200 described with respect to FIG. 2.

In some embodiments, the presence of an isolation region, such as the isolation region 1016, between the gate region and the corresponding source or drain region, reduces the strong electrical field that exists at a high operation voltage, results in smaller depletion regions compared to other structures without such isolation region, and further improves the breakdown voltage of the JFET. In at least one embodiment, an isolation region similar to the isolation region 1016 is formed in one or more of the JFET structures described with respect to FIGS. 1-8, and one or more effects described herein with respect to the isolation region 1016 is/are also achievable.

Figure 11:
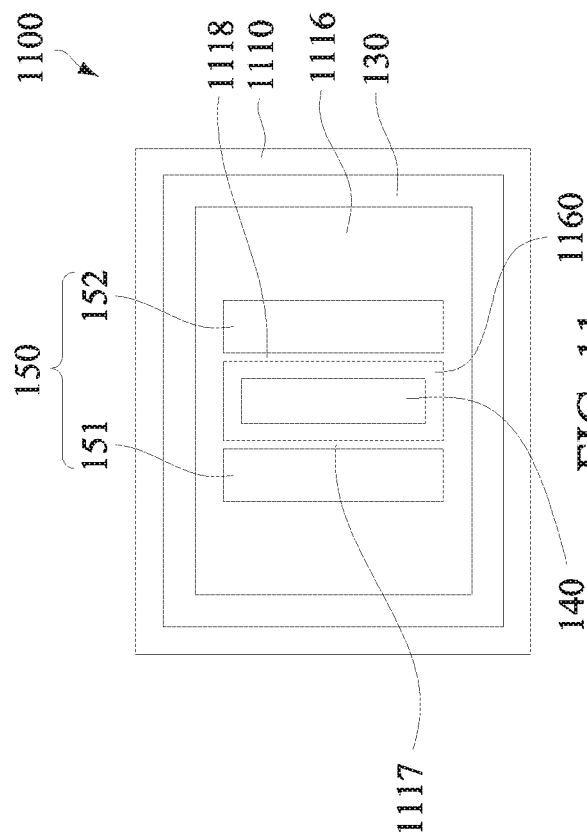
FIG. 11 is a top plan view of a JFET in accordance with some embodiments.

FIG. 11 is a top plan view of a JFET 1100 in accordance with some embodiments. Compared to the JFET 400 described with respect to FIG. 4, the NJFET 1100 is formed in a substrate 1110, and includes a dielectric layer 1160 and an isolation region 1116 under the dielectric layer 1160. In some embodiments, the substrate 1110, dielectric layer 1160 and isolation region 1116 correspond to the substrate 910, dielectric layer 960 and isolation regions 1016 and 116 described with respect to FIG. 10. The isolation region 1116 has portions 1117, 1118 arranged between the source region 140 and the corresponding first and second gate regions 151, 152. The isolation region 1116 extends around the source region 140, and also around the first and second gate regions 151, 152. One or more effects described with respect to the JFETs 400, 900 and 1000 in corresponding FIGS. 4, 9 and 10 are achievable in the JFET 1100 in accordance with some embodiments.

Figure 12:
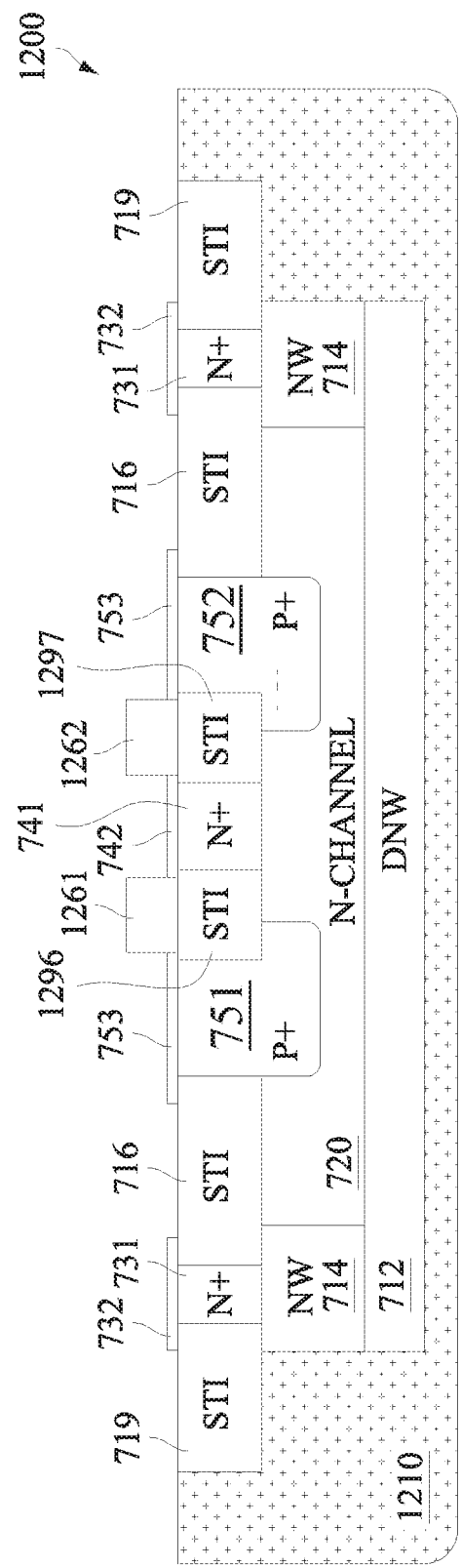
FIG. 12 is a cross-sectional view of an NJFET in accordance with some embodiments.

FIG. 12 is a cross-sectional view of an NJFET 1200 in accordance with some embodiments. Compared to the NJFET structure described with respect to FIG. 7D, the NJFET 1200 is formed in a substrate 1210, and includes at least one dielectric layer 1261, 1262 and at least one isolation region 1296, 1297 under the corresponding dielectric layer 1261, 1262. In some embodiments, the substrate 1210, the at least one dielectric layer 1261, 1262, and at least one the isolation region 1296, 1297 correspond to the substrate 910, dielectric layer 960 and isolation region 1016 described with respect to FIG. 10.

In at least one embodiment, the NJFET 1200 is manufactured by the a process similar to that described with respect to FIGS. 6 and 7A-7D, with the following differences. Specifically, the at least one isolation region 1296, 1297 is additionally formed in the portion 713 (FIG. 7A) where a source region and a gate region of the NJFET 1200 are to be formed. In at least one embodiment, the at least one isolation region 1296, 1297 is formed together with the isolation regions 716, 719 in the same process, and/or from the same material and/or to the same depth. Other arrangements are within the scope of various embodiments. In one or more operations, the source enhancement layer 741 is formed in a central portion surrounded by the at least one isolation region 1296, 1297. In one or more operations, the first and second gate regions 751, 752 are formed around the at least one isolation region 1296, 1297 (as described with respect to FIG. 10), or on opposite sides of at least one isolation region 1296, 1297 (as described with respect to FIG. 11). In one or more operations, the at least one dielectric layer 1261, 1262 is formed over the corresponding at least one isolation region 1296, 1297, to electrically isolate the source and gate contact layers 742 and 753 from each other.

Some embodiments provide a PJFET manufacturing process similar to that described with respect to FIG. 8, with one or more of the differences described with respect to the manufacturing process of NJFET 1200.

In some embodiments, the provision of a dielectric layer, such as an RPO layer, over the interface between a gate region and a source/drain region, and/or the provision of an isolation region between upper parts of the gate region and the source/drain region permit leakage reduction and/or breakdown voltage improvement. In one or more embodiments, one or more of such arrangements(s) and/or effect(s) are useful in semiconductor devices formed in high-resistivity substrates, such as SOI substrates.

According to some embodiments, a JFET comprises a substrate, a source region formed in the substrate, a drain region formed in the substrate, a channel region formed in the substrate, and at least one gate region formed in the substrate. The channel region connects the source and drain regions. The at least one gate region contacts one of the source and drain regions at an interface, and the at least one gate region is isolated from the other of the source and drain regions. A dielectric layer covers the interface while exposing portions of the gate region and the one of the source and drain regions.

According to some embodiments, a semiconductor device comprises a substrate, and at least one transistor formed in the substrate. The at least one transistor comprises source and drain regions formed in the substrate, first and second gate regions formed in the substrate, and a channel region formed in the substrate. The first and second gate regions are at least partially co-elevational with the source and drain regions. One of the source and drain regions is disposed between the first and second gate regions. The channel region connects the source and drain regions. An isolation region is arranged between (i) upper parts of the first and second gate regions and (ii) an upper part of the one of the source and drain regions.

In a method of manufacturing a transistor according to some embodiments, an isolation region, a channel region, and source and drain regions are formed in a substrate. In a plan view of the substrate, one of the source and drain regions is surrounded by the other of the source and drain regions. A gate region is formed in the substrate. The isolation region is arranged between the gate region and the one of the source and drain regions. A dielectric layer is formed over the isolation region arranged between the gate region and the one of source and drain regions. Contact layers are formed over the corresponding gate, source and drain regions. The dielectric layer isolates the contact layer over the gate region from the contact layer over the one of source and drain regions.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A junction gate field-effect transistor (JFET), comprising:
   a substrate;
   a first source/drain region disposed in the substrate;
   a second source/drain region disposed in the substrate;
   a channel region disposed in the substrate, the channel region connecting the first source/drain region and the second source/drain region;
   a gate region disposed in the substrate, the gate region contacting the first source/drain region at a first interface, the gate region isolated from the second source/drain region by an isolation region; and
   a dielectric layer covering the first interface while exposing a portion of the gate region and a portion the first source/drain region, wherein the dielectric layer has a width in a range from 0.5 µm to 5 µm.

2. The JFET of claim 1, wherein the gate region is configured to cause a depletion region to extend from the first interface into the first source/drain region in response to a reverse bias voltage applied to the gate region.

3. The JFET of claim 1, wherein the dielectric layer comprises a resist protective oxide (RPO) layer.

4. The JFET of claim 1, wherein the dielectric layer extends around the first source/drain region in a plan view.

5. The JFET of claim 1, wherein the gate region extends around the dielectric layer and the first source/drain region in a plan view.

6. The JFET of claim 1, wherein the second source/drain region extends around the gate region in a plan view.

7. The JFET of claim 1, further comprising:
   a first contact layer over the portion of the gate region; and
   a second contact layer over the portion of the first source/drain region, wherein the dielectric layer is arranged between the first contact layer and the second contact layer, and wherein the dielectric layer is at least partially co-elevational with the first contact layer and the second contact layer.

8. The JFET of claim 1, wherein the first source/drain region comprises a doped region having a same dopant type as the channel region and a higher dopant concentration than the channel region.

9. A device comprising:
   a first source/drain region in a semiconductor substrate;
   a gate in the semiconductor substrate surrounding the first source/drain region, the gate forming a first interface with the first source/drain region;
   an isolation region surrounding the gate;
   a second source/drain region surrounding the isolation region;
   a channel region under the isolation region and connecting the first source/drain region to the second source/drain region; and
   a first dielectric layer extending across the first interface between the gate and the first source/drain region.

10. The device of claim 9 further comprising a first source/drain contact adjacent the first dielectric layer and electrically connected to the first source/drain region.

11. The device of claim 10 further comprising a first gate contact on an opposing side of the first dielectric layer as the first source/drain contact, the first gate contact electrically connected to the gate.

12. The device of claim 10, wherein the first source/drain contact contacts the isolation region.

13. The device of claim 9 further comprising a second dielectric layer extending across a second interface between the gate and the first source/drain region, a first source/drain contact between the first dielectric layer and the second dielectric layer.

14. The device of claim 9, wherein the gate comprises a p-type doped region, and wherein the first source/drain region and the second source/drain region each comprise a n-type doped region.

15. A semiconductor device comprising:
   a semiconductor substrate;
   a first source/drain region in the semiconductor substrate;
   a gate in the semiconductor substrate and encircling the first source/drain region in a top-down view;
   a first source/drain contact electrically connected to the first source/drain region, the first source/drain contact extending between a first dielectric layer and a second dielectric layer, each of the first dielectric layer and the second dielectric layer contacting both the gate and the first source/drain region;
   a shallow trench isolation (STI) region extending into the semiconductor substrate, the STI region contacting a sidewall of the gate; and
   a gate contact electrically connected to the gate, wherein the gate contact further contacts a top surface of the STI region.

16. The semiconductor device of claim 15, wherein the first dielectric layer separates the gate contact from the first source/drain contact.

17. The semiconductor device of claim 15 further comprising:
   a second source/drain region in the semiconductor substrate, the second source/drain region separated from the gate by the STI region, wherein the second source/drain region encircles the STI region; and
   a channel region under the STI region and extending from the first source/drain region to the second source/drain region.

18. The semiconductor device of claim 15, wherein the gate touches opposing sides of the first source/drain region.

19. The semiconductor device of claim 15, wherein the gate extends further into the semiconductor substrate than the first source/drain region.

\* \* \* \* \*